United States Patent
Hode et al.

(10) Patent No.: US 7,136,001 B2
(45) Date of Patent: Nov. 14, 2006

(54) CONTINUOUS-TIME INTEGRATING FILTER WITH MINIMUM PHASE VARIATION, AND BANDPASS ΣΔ MODULATOR USING SUCH A FILTER

(75) Inventors: Jean-Michel Hode, St Cloud (FR); Christophe Flouzat, St Gratien (FR); Jean-Luc De Gouy, Briis sous Forges (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 10/382,097

(22) Filed: Mar. 6, 2003

(65) Prior Publication Data
US 2004/0041665 A1 Mar. 4, 2004

(30) Foreign Application Priority Data
Mar. 8, 2002 (FR) .......................................... 02 02957

(51) Int. Cl.
*H03M 3/00* (2006.01)

(52) U.S. Cl. ..................................................... 341/143
(58) Field of Classification Search ................. 341/143
See application file for complete search history.

(56) References Cited
U.S. PATENT DOCUMENTS 4,395,904 A * 8/1983 Ivanov et al. ............... 73/118.1
4,467,291 A    8/1984 Roza
5,136,651 A    8/1992 Cooper et al.

FOREIGN PATENT DOCUMENTS

DE    27 57 460 A1    6/1978
DE    35 04 383 A1    8/1986

* cited by examiner

Primary Examiner—Brian Young
(74) Attorney, Agent, or Firm—Lowe Hauptman & Berner LLP

(57) ABSTRACT

The disclosure pertains to continuous-time filtering. More particularly, it relates to filtering in a feedback control loop, for example in a sigma-delta (ΣΔ) modulator. The making of a filter for this type of application comes up against a major problem linked to the relativity between the amplitude and phase responses. This limits the possibilities of choice in order to take steps against the instability of the loop. A continuous-time filter with minimum phase variation carries out the bandpass integration of the signal presented at its input. The making of the continuous-time filter as a bandpass integrator raises the problem of achieving a compromise between gain variations and phase variations close to the −1 critical point, This compromise must lead to the stability of the loop. This problem is resolved by using a continuous-time bandpass integrating filter comprising at least one resonance device with minimum phase variation.

13 Claims, 6 Drawing Sheets

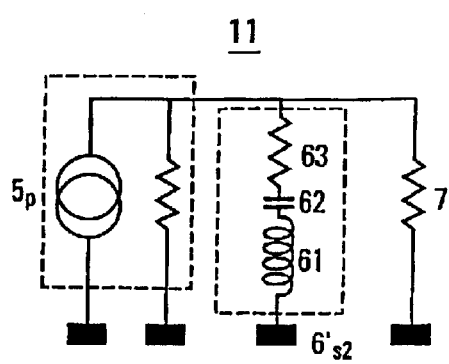
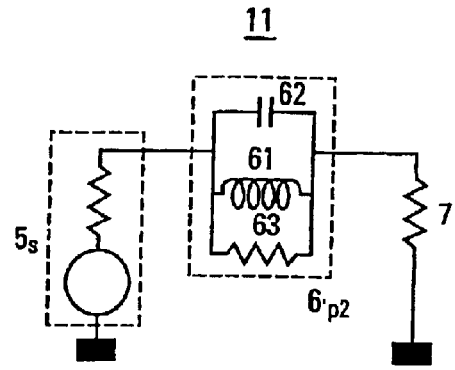
Fig. 6a          Fig. 6b
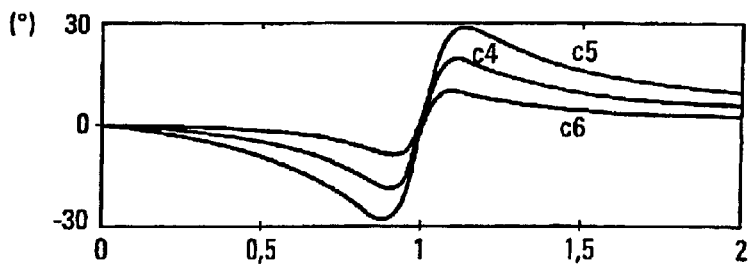
Fig. 7a
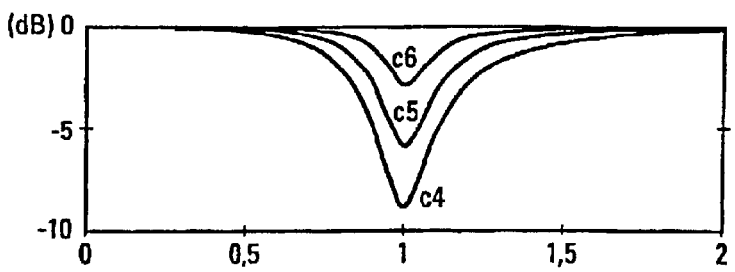
Fig. 7b
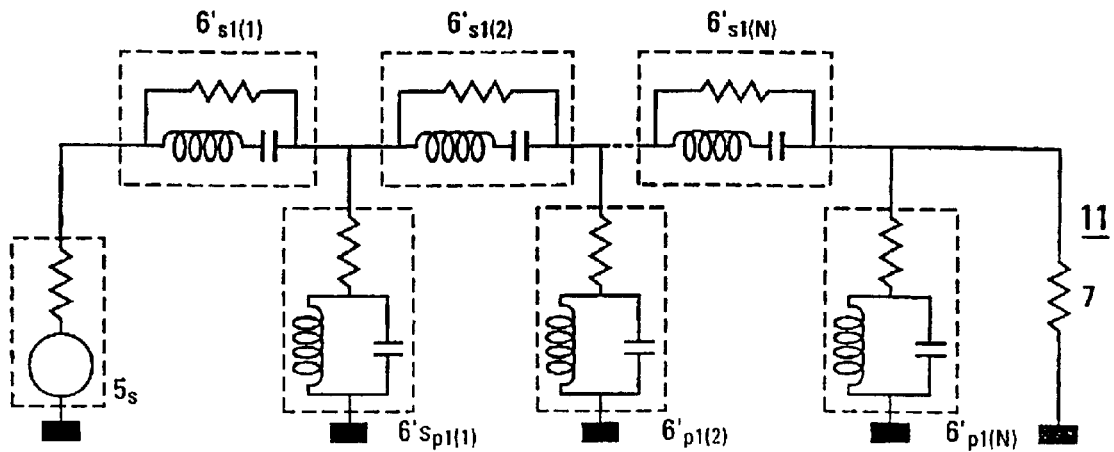
Fig. 8

CONTINUOUS-TIME INTEGRATING FILTER WITH MINIMUM PHASE VARIATION, AND BANDPASS ΣΔ MODULATOR USING SUCH A FILTER

BACKGROUND OF THE INVENTION

1. Field of the Invention

The invention relates to continuous-time filtering. More particularly, it relates to filtering in a feedback control loop, for example in a sigma-delta (ΣΔ) modulator. Analog ΣΔ modulators can be used, for example, in radar receivers or telecommunications systems, in particular to improve the resolution of analog-digital encoding.

2. Description of the Prior Art

The ΣΔ modulation of a signal consists of the encoding of this signal on a small number of bits but with a far higher resolution than the theoretical limit given by the number of bits. To this end, a feedback control loop is made. The quantization device, which limits the resolution, is placed at output of this loop as can be seen in the generic diagram of FIG. 1(a).

If the signal is a digital signal, the ΣΔ modulator unit is made as a digital device. When the digital signal at the input of the ΣΔ modulator comprises N bits, the return signal comprises N bits including N−n null least significant bits (LSB), the input signal of the integration device 1 comprises N+1 bits, and the signal at the input and output of the quantization device 2 respectively comprises N bits and n bits (where n is far smaller than N). Thus, the signal encoded at output of the ΣΔ modulator has a small number of bits and high resolution in the band. This is typically the case in CD readers where the output of the modulator is obtained on 1 bit whereas the input signal is encoded on about 20 bits.

However, if the signal is an analog signal, with the analog-digital converter 2 (a source of quantization that limits the resolution) being placed at output of the loop as can be seen in FIG. 1(b), the result is that the filtering 11, which integrates the input/output error, is necessarily an analog filtering. Two cases arise. The first is that frequency of the signal is low enough. In this case the signal may be sampled at the entry to the loop (not shown) before the filtering 11, which is then done in the discrete time domain (using switched capacitors for example). The second possible case arises at higher frequencies, especially on carriers: in this case the discrete time techniques (switched-capacitor or switched-current loop techniques, especially) are inappropriate. The filtering 11 can then be continuous-time filtering. The most commonly used technology here is the GmC technology (entailing the use of transconductance amplifiers). The sampling is then done at output of the loop, just before the quantization (analog-digital conversion).

Furthermore, referring again to the high frequencies, the cumulated conversion times of the analog-digital converter (ADC) 2 and of the digital-analog analog converter de (DAC) 3 are spread over several sampling periods instead of being smaller than a single period. This problem disappears if the encoding is done on only one bit, but then the very high non-linearity of the encoding function means that it is not possible to define a criterion of stability for the ΣΔ modulator with certainty. A multi-bit encoding is then preferred. For this encoding, the response of the open loop may be considered to be a first-order linear response.

The making of the loop filter 11 must then resolve the classic problem of feedback control loops: providing the maximum gain (and thus minimizing the error between the feedback-controlled signal and the control) while preserving the stability of the loop. This is especially difficult to achieve since the total delay time of the loop, also known as the latency number, is great. It is the difficulty of finding filtering functions that perform well, even in the presence of high latency numbers, that has hitherto hampered the development of continuous-time ΣΔ modulators.

SUMMARY OF THE INVENTION

The present invention resolves the difficulties of continuous-time filtering quasi-optimally by minimizing the phase of the filter in the frequency domain where the gain of the loop is close to 1 in terms of modulus.

In particular, the invention proposes a continuous-time filter carrying out the bandpass integration of the signal presented at its input, comprising at least one element with a phase variation known as a minimum phase variation.

Minimum phase variation elements are elements whose unfolded phase, namely the phase reconstituted by continuity at the points of ambiguity, tends to zero when the frequency tends towards zero or infinity.

The making of a filter in real-time as a bandpass integrator raises the problem of compromise between variations of gain and variations of phase close to the −1 critical point. This compromise must lead to the stability of the loop. Owing to causality, these variations are linked by the Bayard-Bode relations. This problem is resolved by using a continuous-time bandpass integrating filter comprising at least one resonance device with minimum phase variation. In particular, said resonance device with minimum phase variation comprises a resonator and a resistor.

Another object of the invention is the feedback loop comprising a continuous-time bandpass integrating filter of this kind. This feedback loop may be constituted in particular by a ΣΔ modulator. For example, a bandpass ΣΔ modulator forming a feedback loop comprises an analog-digital converter, a return digital-analog converter and a continuous-time bandpass integrating filter of this kind.

BRIEF DESCRIPTION OF THE DRAWINGS

The characteristics and advantages of the invention shall appear more clearly from the following description, given by way of an example, and from the appended figures, of which:

FIGS. 6(a) and 6(b) show a third variant and a fourth variant of first-order continuous-time bandpass integrating filters according to the invention, FIGS. 7(a) and 7(b) show the frequency responses, in phase and in amplitude respectively, of the filters of FIGS. 6, as a function of the overvoltage of the resonator $Q_d$.

FIG. 8 shows a fifth variant of a higher-order continuous-time bandpass integrating filter according to the invention.

MORE DETAILED DESCRIPTION

A bandpass ΣΔ modulator enables the digital encoding of a signal with a resolution in the useful band that is far higher than that obtained with a classic encoder. Its real function, apart from the digitization, is that it shapes the quantization noise so that, in the useful band, the spectral density of this noise is far smaller than the noise coming from a classic encoder. This reduction of the spectral power density of the quantization noise in the useful band is expressed by an equivalent gain in resolution after filtering of the out-of-band noise and decimation.

Figures 1A, 1B:
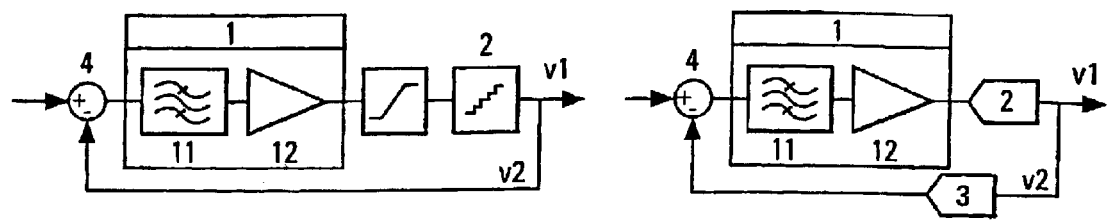
FIGS. 1(a) and 1(b) are generic diagrams of a continuous-time bandpass ΣΔ modulator, respectively for the processing of any signal and of an analog signal

La FIG. 1 is a schematic of an exemplary continuous-time bandpass ΣΔ modulator. The continuous-time bandpass ΣΔ modulator is a feedback loop. On the direct channel v1 of the loop, the modulator comprises an integration device 1 followed by an analog-digital converter (ADC) 2. The integration device 1 comprises a filtering device 11 enabling integration and an amplifier 12 of the error in the useful band. On the return channel v2, the modulator comprises a digital-analog converter (ADC) 3. This converter (ADC) 3 is used to convey the converted signal obtained at output of the ΣΔ modulator to the input of this modulator. An operator 4 is placed at the input of the loop before the integration device 1. It receives the signal to be encoded present at the input of the ΣΔ modulator coming, for example, from the input stages of the receiver when the ΣΔ modulator is used in a radar or telecommunications system. It furthermore receives the converted signal coming from the return channel after the digital-analog conversion. This operator 4 assesses the difference between the input signal and the converted signal so that the bandpass integration device 1 carries out the integration, in the band, of the error between the output signal and the input signal.

The gain of the open loop is far greater than 1 in the useful band so much so that, in this useful band, the error between the output signal and the input signal is necessarily very low; this is the principle of a feedback loop. This causes the quantization noise at output of the loop to be rejected by a factor equivalent to this gain. This quantization noise at the output signal results from the analog-digital conversion.

The gain of the loop therefore must be as high as possible. However, in view of the periods of time needed to make the two conversions 2 and 3, it is not possible to choose as great a gain as desired. Indeed, in practice, the loop must meet the Nyquist criterion. Hence, for given converters 2 and 3, the stability of the loop is entirely determined by the filtering 11 and the gain 12 of the integration operation 1.

To minimize the delay linked to the filtering and, therefore, preserve the stability of the loop, the bandpass filter 11 must be a multipole filter when it is made as a continuous-time device. This type of continuous-time filter may be represented, in its principle, as a cascade of first-order resonators each sandwiched by perfect amplifiers and each forming a first-order filter. The transfer function of the assembly is the sum (in terms of logarithmic amplitude and phase) of the individual responses. These responses are obtained by placing these resonators, in series or in parallel, between, firstly, a generator 52 with internal impedance 51 and, secondly, a load 7. The LC resonators shown in FIGS. 2(*a*) and 2(*b*) are envisaged for this purpose in the usual way.

Figures 2A, 2B:
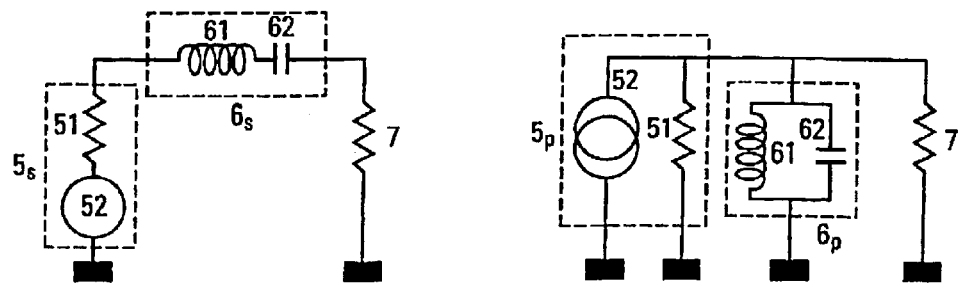
FIGS. 2(a) and 2(b), are prior art first-order continuous-time bandpass integrating filters.

FIG. 2(*a*) illustrates a series resonator. It comprises a series LC circuit $6_s$, series-connected with an inductor L 61 and a capacitor C 62. FIG. 2(*b*) illustrates a parallel resonator. It comprises a parallel LC circuit $6_p$, parallel-connected with an inductor L 61 and a capacitor C 62.

However, such continuous-time filters 11 with a simple LC resonator 6 do not have a phase with minimum variations. In practice, it is important that the phase should return to zero, at a great distance from the resonance frequency or the anti-resonance frequency. Indeed, if this is not verified, the loop in which such a filter is placed shows instability.

Figure 3A:
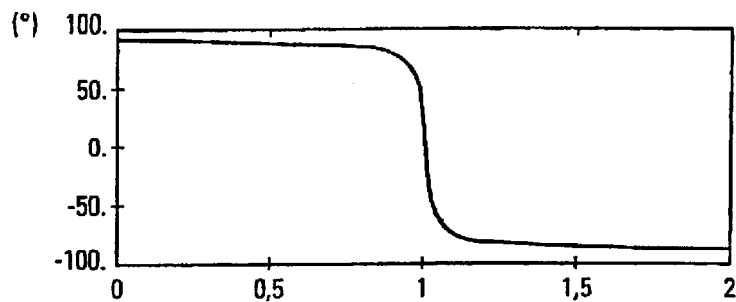
FIGS. 3(a) and 3(b) are the frequency responses, in phase and in amplitude respectively, of the filters of FIG. 2, FIGS. 4(a) and 4(b) show a first variant and a second variant of first-order continuous-time bandpass integrating filters according to the invention.
Figure 3B:
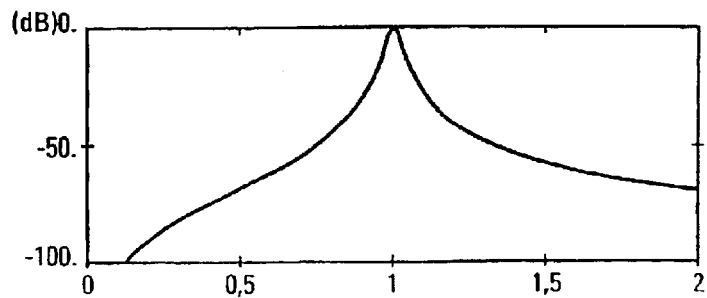

FIG. 3(*a*) shows the phase response of the resonance devices of FIG. 2 as a function of the frequency. The frequency axis is normalized with respect to the resonance frequency. The phase presented by FIG. 3(*a*) tends toward 90° when the frequency tends to toward 0 or it tends towards −90° when the frequency tends towards infinity. Now, to have a minimum phase variation, the phase must tend toward zero when the frequency tends toward zero or infinity. Hence, according to FIG. 3(*a*), the filters with a simple LC resonator as proposed in FIG. 2 are not filters with what is called a "minimum" phase variation.

FIG. 3(*b*) shows the amplitude response of the resonance devices of FIG. 2 as a function of frequency. The axis of the frequencies is normalized with respect to the resonance frequency. The amplitude does not get saturated at a great distance from the resonance frequency. The shape of the amplitude response, by a relation of causality, explains the type of phase variation observed in FIG. 2(*a*).

In order to have high stability while, at the same time, having satisfactory gain, the filter 11 must be a continuous-time bandpass integrating filter with minimum phase variation. More specifically, it has a transfer function with the form:

$$H(p) \propto \frac{p^2 + \frac{\omega_0}{Q_N} p + \omega_0^2}{p^2 + \frac{\omega_0}{Q_D} p + \omega_0^2}$$

The function achieved differs according to the values of $Q_N$ and $Q_D$. Indeed, if $Q_D \geq Q_N$ the function achieved is a band filtering function with phase delay because the phase decreases with the frequency about the resonance frequency.

If $Q_D \leq Q_N$, the filter made is a band rejector with phase lead. $Q_D$ represents the maximum of the transfer function in amplitude of the resonator 6 (or resonance device). The ratio $Q_D/Q_N$ represents the ratio between the maximum and the minimum of the transfer function in amplitude of the resonator 6 (or resonance device).

The present invention achieves this by proposing resonance devices $6'_{s1}$, $6'_{s2}$, $6'_{p1}$, $6'_{p2}$, $6''_s$ and $6''_p$ instead of the resonators 6.

The first, second, third and fourth variants of the invention are illustrated by FIGS. 4(a), 4(b), 6(a) and 6(b). To make a resonance device $6'_{s1}$, $6'_{s2}$, $6'_{p1}$, or $6'_{p2}$, these devices propose the adding, to the LC circuit 6, of a resistor either in series or in parallel.

Figure 4A:
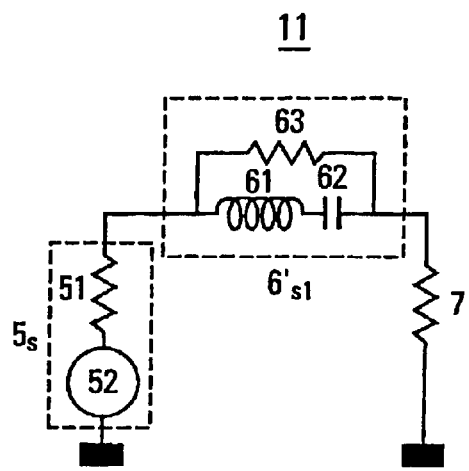

In a first variant of the filter according to the invention as shown in FIG. 4(a), a resistor 63 is placed in parallel on a series resonator 61–62. Thus, in conditions of resonance, the resonator 61–62 is preponderant in the operation of the resonance device $6'_{s1}$. And, when the circuit is far from the conditions of resonance, when the impedance of the resonator 61–62 is great, the resistance 63 becomes preponderant. This is illustrated by FIGS. 5(a) and 5(b).

Figure 5A:
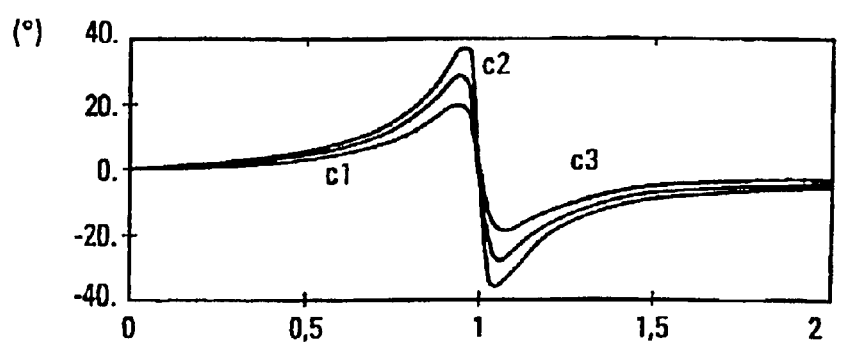
FIGS. 5(a) and 5(b), show the frequency responses, in phase and in amplitude respectively, of the filters of FIG. 4, as a function of the overvoltage of the resonator $Q_d$.

FIG. 5(a) shows different responses in phase of this variant of the filter 11 as a function of the frequency for a value $Q_N=7$. The responses represented by the curves c1, c2 and c3 correspond to those of a filter 11 for which the respective value of $Q_D=10$, 20 and 14. The frequency axis is normalized with respect to the resonance frequency. The resonance device $6'_{s1}$ is a minimum phase variation element as indicated in FIG. 5(a). Indeed, the phase tends toward 0 when the frequency tends toward 0 or infinity.

Figure 5B:
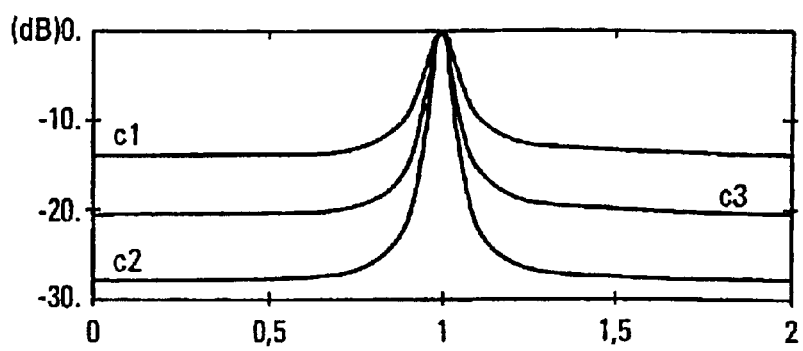

FIG. 5(b) represents different responses in amplitude of this variant of the filter 11 as a function of the frequency for a value $Q_N=7$. The responses represented by the curves c1, c2 and c3 correspond to those of a filter 11 for which the respective value of $Q_D=10$, 20 and 14. The axis of the frequencies is normalized with respect to the resonance frequency.

Figure 4B:
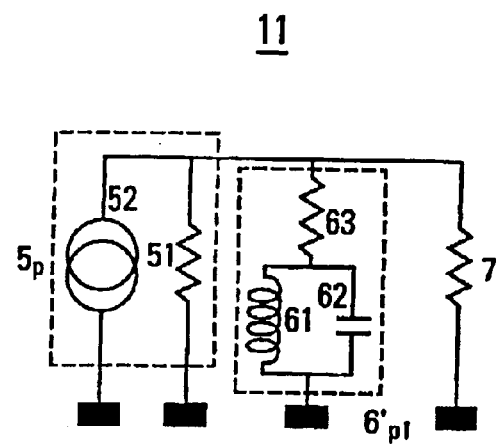

In a dual way, a resistor 63 may be series-connected with a parallel-type resonator 61–62 to form a resonance device $6'_{p1}$ as illustrated by FIG. 4(b).

The transfer function of this type of resonance device $6'_1$ has the following general shape:

$$H(p) = \frac{1 + Q_N\left(\frac{p}{\omega_0} + \frac{\omega_0}{p}\right)}{1 + Q_D\left(\frac{p}{\omega_0} + \frac{\omega_0}{p}\right)} = \frac{Q_N}{Q_D} \frac{p^2 + \frac{\omega_0}{Q_N}p + \omega_0^2}{p^2 + \frac{\omega_0}{Q_D}p + \omega_0^2}$$

with $\begin{cases} Z = \sqrt{\frac{L}{C}} \\ LC\omega_0^2 = 1 \end{cases}$ and: $\begin{cases} Q_N = \frac{Z}{R} \\ Q_D = \left(\frac{1}{R} + \frac{1}{2R_0}\right)Z \end{cases}$ for the series resonance devices $6'_{s1}$, and $\begin{cases} Q_N = \frac{R}{Z} \\ Q_D = \frac{1}{Z}\left(R + \frac{R_0}{2}\right) \end{cases}$ for the series resonance devices $6'_{p1}$.

By modifying and placing the elements of these resonance devices 6' differently as shown in FIGS. 6(a) and 6(b), the filters made have a band rejection function with phase lead. In the third variant of the filter 11 according to the invention of FIG. 6(a), a resistor 63 is series-connected with an LC series resonator 61–62 placed in parallel. Thus, in conditions of resonance, the resistor 63 becomes preponderant in the working of the resonance device $6'_{s2}$. And, when the operation is far from the resonance conditions, the incidence of the resonator 61–62 becomes great as compared with the resistor 63. This is illustrated by the frequency responses of this variant of the filter 11 in phase as shown in FIG. 7(a) and in amplitude as shown in FIG. 7(b).

FIG. 7(a) shows different responses in phase of this variant of the filter 11 comprising a resonance device $6'_{s2}$ as a function of the frequency for a value $Q_N=7$. The responses represented by the curves c4, c5 and c6 correspond to those of a filter 11 for which the respective value of $Q_D=2.5$, 3.5 and 5. The frequency axis is normalized with respect to the resonance frequency. The resonance device $6'_{s2}$ is a minimum phase variation element as indicated in FIG. 7(a). Indeed, the phase tends toward 0 when the frequency tends toward 0 or infinity.

FIG. 7(b) represents different responses in amplitude of this variant of the filter 11 comprising a resonance device $6'_{s2}$ as a function of the frequency for a value $Q_N=7$. The responses represented by the curves c4, c5 and c6 correspond to those of a filter 11 for which the respective value of $Q_D=2.5$, 3.5 and 5. The axis of the frequencies is standardized with respect to the resonance frequency.

Hence, depending on the type of resonance device desired (for example a phase delay device, a phase lead device etc), the structure of this resonance device is made in such a way that the function of the resistor 63 becomes preponderant over that of the resonator in one or more determined frequency bands (respectively, the frequency band excluding the resonance frequency, the frequency band including the resonance frequency etc).

In a dual way, a resistor 63 may be placed in parallel with an LC resistor 61–62 of a parallel type placed in series with a resonance device $6'_{p2}$ as shown in FIG. 6(b)

The transfer function of this type of resonance device $6'_2$ has the following general form:

$$H(p) = \frac{\frac{1}{Q_N} + \left(\frac{p}{\omega_0} + \frac{\omega_0}{p}\right)}{\frac{1}{Q_D} + \left(\frac{p}{\omega_0} + \frac{\omega_0}{p}\right)} = \frac{p^2 + \frac{\omega_0}{Q_N}p + \omega_0^2}{p^2 + \frac{\omega_0}{Q_D}p + \omega_0^2}$$

with $\begin{cases} Z = \sqrt{\frac{L}{C}} \\ LC\omega_0^2 = 1 \end{cases}$ and: $\begin{cases} \frac{1}{Q_N} = \frac{R}{Z} \\ \frac{1}{Q_D} = \frac{1}{Z}\left(R + \frac{R_0}{2}\right) \end{cases}$ for the series resonance devices $6'_{s2}$ and $\begin{cases} \frac{1}{Q_N} = \frac{Z}{R} \\ \frac{1}{Q_D} = \left(\frac{1}{R} + \frac{1}{2R_0}\right)Z \end{cases}$ for the series resonance devices $6'_{p2}$.

Figure 12:
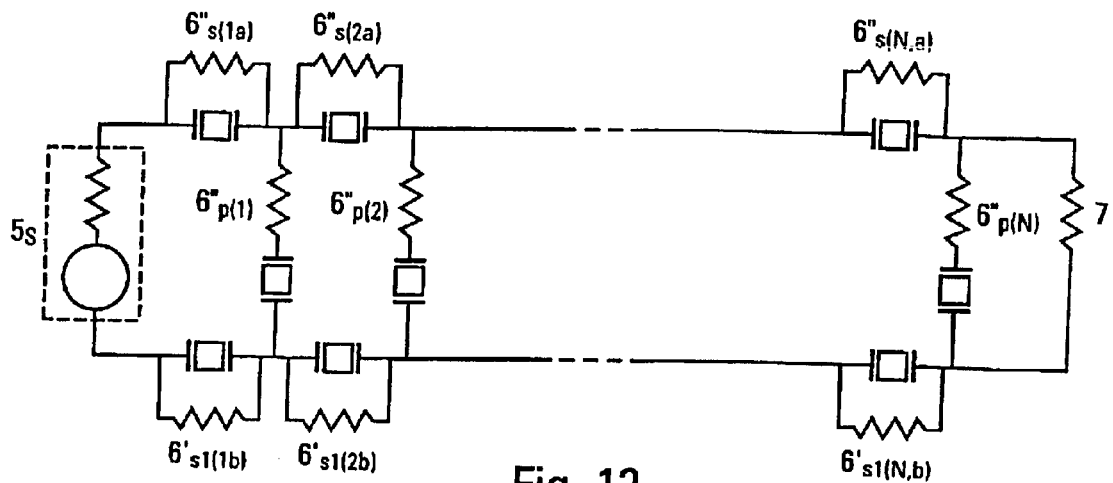
FIG. 12 shows a seventh variant of a higher-order continuous-time bandpass integrating filter in differential mode using the equivalent resonance device of FIG. 10 with a ladder structure, FIGS. 13(*a*) and 13(*b*) show the frequency responses, in phase and in amplitude respectively, of the filter of FIG. 12.

A higher-order filter 11 is constituted by several basic elements, namely the resonance devices. Hence, the making of a higher-order filter 11 according to the invention may comprise a cascade of one or more of the first to fourth variants of resonance devices $6'_{s1}$, $6'_{s2}$, $6'_{p1}$, $6'_{p2}$ proposed here above. This cascade, used to obtain a higher-order filter, may be made either through amplifiers which enable a multiplication of the transfer functions, or by direct assembly to make filters in ladder configuration as illustrated in FIG. 8, or by assembly in a balanced bridge structure as illustrated in FIG. 12.

FIG. 8 shows only resonance devices $6'_{s1}$, $6'_{p1}$, comprising filtering elements but it is clear that the following combinations may be extended without difficulty, in any general application, to the phase lead elements $6'_{s2}$, $6'_{p2}$. They can also be applied jointly. The filter 11 of FIG. 8 is a cascade, in a ladder configuration, of resonance devices $6'_{s1}$, $6'_{p1}$ placed in alternation. Each pair of resonance devices $6'_{s1}$, $6'_{p1}$ forms a section. The filter 11 is constituted by N sections.

Figure 9:
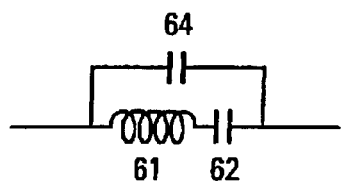
FIG. 9 shows a circuit equivalent to the resonator according to the prior art, FIGS. 10(*a*) and 10(*b*) show two exemplary embodiments of the equivalent resonance device according to the invention.

In practice, it may be difficult to have inductors with very high quality factor values. This prevents the making (with inductors and capacitors) of resonators having high overvoltages. Now the overvoltage of the resonators is a fundamental factor for the loop stability of a $\Sigma\Delta$ modulator, especially in the case of high conversion times, because the greater this overvoltage, the lower the phase in the critical zone. This is the reason for the use of monolithic or integrated resonator technologies having very high overvoltages. The devices belonging to these technologies include, non-exhaustively, bulk acoustic wave resonators (BAW) and their TFR (thin-film resonator) or FBAR (fundamental bulk acoustic resonator) or HBAR (high-order bulk acoustic resonator) variants, surface acoustic wave (SAW) resonators, dielectric resonators, MEMS (microelectromechanical systems) resonators and the like. However, very often, these resonators are not simple series or parallel LC circuits 61–62 but rather have an equivalent diagram, as illustrated in FIG. 9, formed by a series-mounted resonant branch with the LC components 61–62 and a parallel static capacitor 64. Thus, they have both resonance and anti-resonance.

Figure 10A:
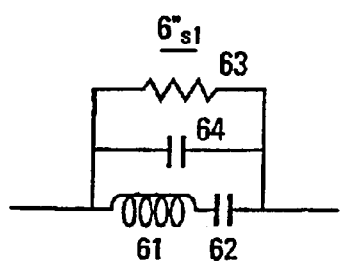
Figure 10B:
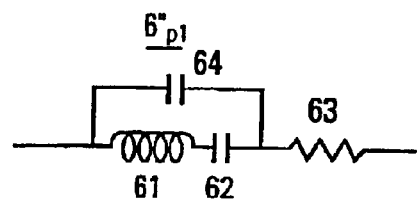

The resonance devices $6''_s$, $6''_p$ can thus be modified as shown in FIG. 10(a) for a series LC resonator 61–62 whose operation will be of a serial type in filtering or of a parallel type in phase lead, and as shown in FIG. 10(b) for an LC resonator 61–62 whose operation will be of a parallel type in filtering or of a serial type in phase lead. These resonance devices $6''_s$, $6''_p$ are used in the filter 11 which is either a first-order filter, or a higher-order filter as described further above. There are either cascaded through amplifiers or directly coupled in a ladder configuration as illustrated for example in FIG. 11. In this FIG. 11, all the resonance devices $6''_s$, $6''_p$ may be different to optimize the performance characteristics of the entire unit. It must also be noted that, in this figure there is no longer any difference of structure between phase-delay filtering and phase-lead filtering, as this difference occurs through the ratio of the resistance values to the impedance values of the resonators, the frequency band considered and placing of the resistor-resonator pair in the filter.

Figure 11:
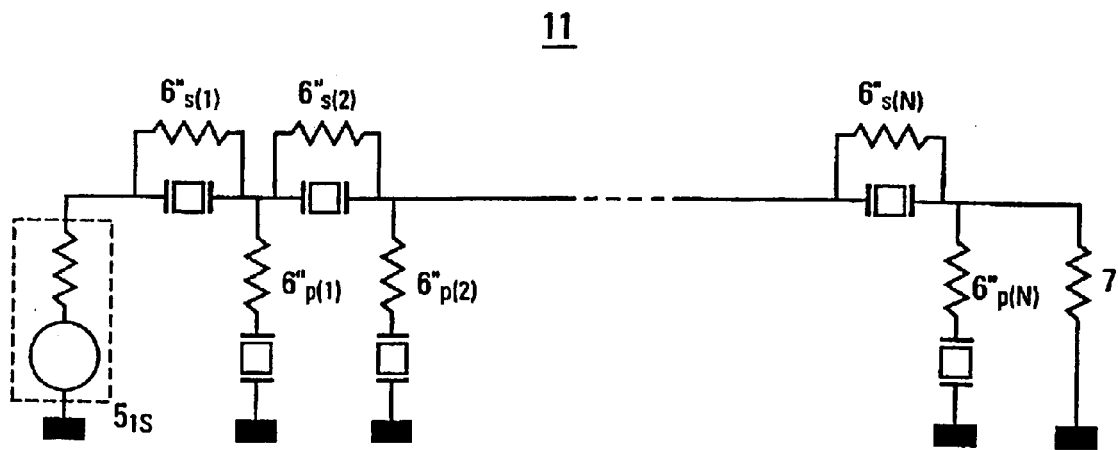
FIG. 11 shows a sixth variant of a higher-order continuous-time bandpass integrating filter in differential mode using the equivalent resonance device of FIG. 10 with a ladder structure.

FIG. 11 can therefore be seen as a generic and general FIG. in which either the static capacitance 64 of a resonance device $6''_s$, $6''_p$ or its series capacitance 62 may have a value of zero. If this should occur for all the resonance devices $6''_s$, $6''_p$, then the structures used are the most general type of inductor and capacitor structures, as described particularly with reference to FIG. 8.

Naturally, the generic structure of FIG. 11 may get symmetrized in an obvious way for operation in differential mode as illustrated by FIG. 12 in which the resonance devices $6''_p$ have impedance double that of the resonance devices $6''_p$ of FIG. 11. Furthermore, the impedance 51 of the source device $5_s$ and the impedance 7 of the filter of the FIG. 12 are, for their part too, double the impedance of FIG. 11.

Figure 13B:
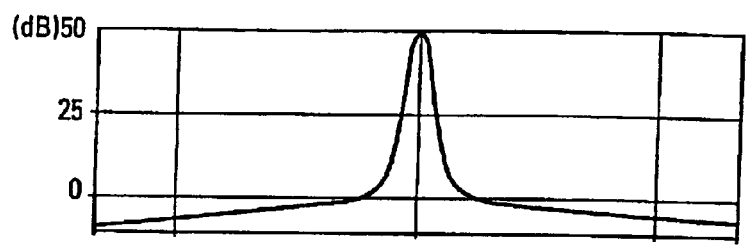
Figure 13A:
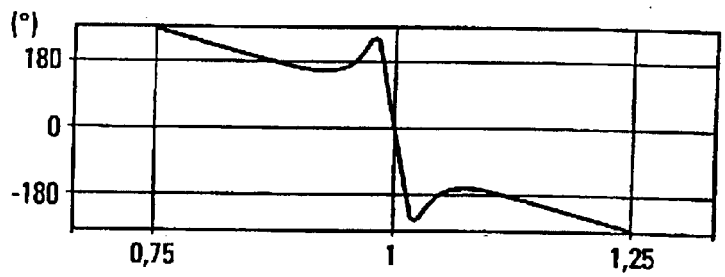

A typical frequency response obtained by means of this type of filter structure is shown in phase by FIG. 13(a) and in amplitude by FIG. 13(b). This is the linear response approaching the open-loop response of a $\Sigma\Delta$ modulator with a center frequency $f_0 32 3f_s/8$ where $f_s$ is the sampling frequency. An exemplary structure of a $\Sigma\Delta$ modulator such as this is given by FIG. 14. In this figure, this $\Sigma\Delta$ modulator, the pair formed by the analog-digital converter 2 and the digital-analog converter 3 has a to cumulated, overall processing time of 4.82 sampling periods. This response takes account of the spectral aliasing provided by the analog-digital digital converter 2 and the sinc filtering provided by the digital-analog converter 3.

Figure 14:
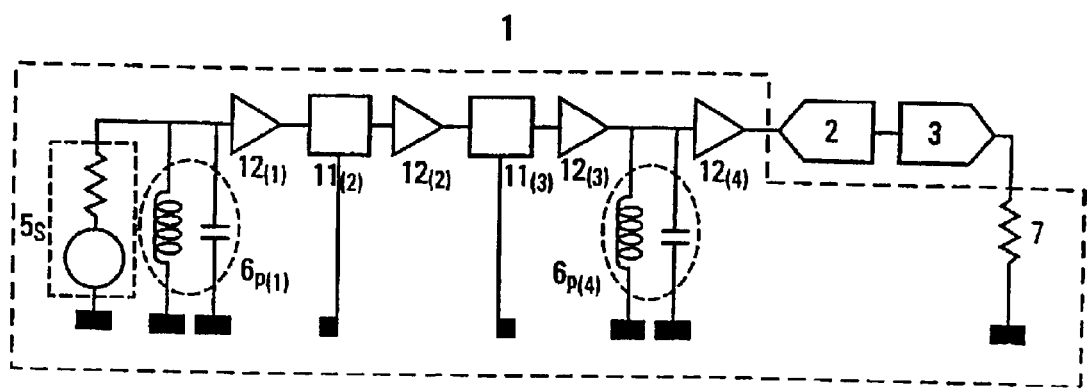
FIG. 14 shows a continuous-time bandpass integrating ΣΔ modulator using the higher-order continuous-time bandpass integrating filter of FIG. 11.

In the example proposed by FIG. 14, the loop filter 11 consists of two filters 11(2) and 11(3). Each of these filters 11 may be subdivided into three sections. The loop filter 11 also has two resonating cells $6_p(1)$ and $6_p(4)$, one on either side of a series circuit with the following in alternation: a first amplifier 12(1), the first filter 11(2), a second amplifier 12(2), the second filter 11(3) and a third amplifier 12(3).

Each of the three sections of the filters 11(2) and 11(3) itself comprises two resonance devices, one being a series device $6''_s$ and the other being a parallel device $6''_p$, as shown in FIG. 11. The resonating cells $6_p(1)$ and $6_p(4)$ are low overvoltage cells because they are designed to minimize the effects on the response of the spectral aliasing provided by the analog-digital converter 2. The working of the modulator in closed loop is then stable with the following margins: ±20 degrees in phase and ±3 dB in amplitude.

The following table brings together exemplary values of the elements of the different sections of the filters 11(2) and 11(3):

```
Swap(e)
{
    a ← onext(e);
    b ← rot⁻¹(e);
    setOrg(a,dest(b));
    setOrg(b,dest(a));
    Splice(a,e);
    Splice(a,sym(b));
    return a;
}
```

Figure 15:
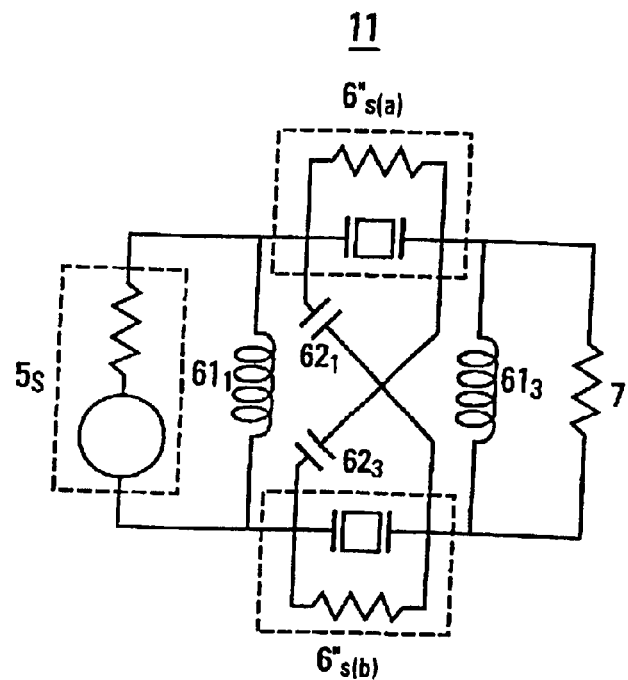
FIG. 15 shows an eighth variant of a higher-order continuous-time bandpass integrating filter in differential mode using the equivalent resonance device of FIG. 10 with a bridge structure, FIGS. 16(*a*) and 16(*b*) show the frequency responses, in phase and in amplitude respectively, of the filter of FIG. 15.

Another structure may be proposed in the specific case of an operation in differential mode. This structure, whose principle is given in FIG. 15, is a balanced bridge structure. The balanced bridge comprises static capacitors 64 of the resonance devices $6''_s(a)$ and $6''_s(b)$ and additional capacitors $62_1$ and $62_3$ with the same value. Through the presence of the two resistors 63(a) and 63(b) and of the two resonating arms 61–62(a) and 61–62(b) of the resonance devices $6''_s(a)$ et $6''_s(b)$, there is an imbalance of the bridge. This makes it possible to obtain the response in the band and furthermore to limit the response in the form of a pseudo-plateau in close-range rejection in order to limit the phase variations.

In the pass band, namely around the resonance of the resonance devices 6"s(a) and $6''_s(b)$, the compensation for the impedance of the additional static capacitors $62_1$ and $62_3$ may be obtained by two inductors $61_1$ and $61_3$. The operation is then the optimum operation for $LC\omega_r^2 32 1$.

These bridge structures may be cascade-connected, generally with different center frequencies to obtain a higher-order filtering.

Figure 16B:
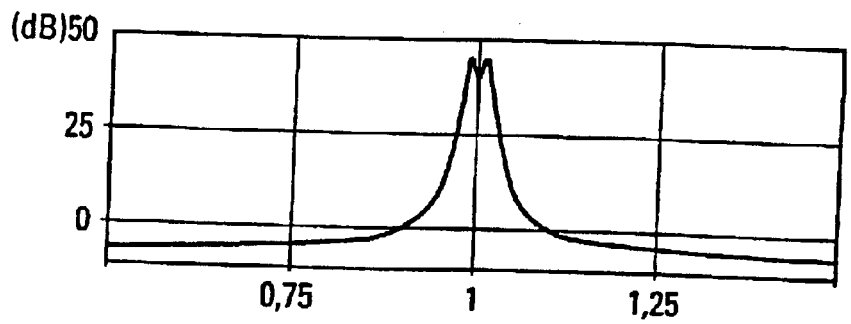
Figure 16A:
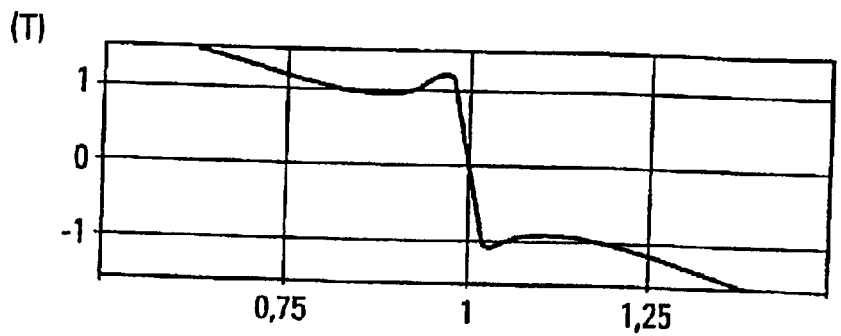

FIGS. 16(a) and 16(b) give an exemplary frequency response, respectively in phase and in amplitude, in an open loop, of a $\Sigma\Delta$ modulator having a center frequency $f_0=3f_s/4$ and comprising a pair consisting of an analog-digital converter 2 and a digital-analog converter 3 with a cumulated, overall processing time of 7.5 sampling periods. The $\Sigma\Delta$ modulator also comprises a filter 11 obtained by a cascade of four bridge-type structures illustrated by FIG. 15. The frequency and impedance values of the resonators verify $$\frac{\omega_a^2}{\omega_r^2} - 1 = \frac{1}{150},$$

$RC\omega_r = 0.943$ and $$\frac{\omega_r - \omega_0}{\omega_0} = \pm 2.53 \cdot 10_{-3} \text{ and } \pm 2.94 \cdot 10_{-3}.$$

The reading of the responses shown in these FIGS. 16(a) and 16(b) indicates that the operation of the closed loop modulator is stable with the following margins: ±20 degrees in phase and ±3 dB in amplitude.

The converters of the ΣΔ modulator may generally be chosen to present delays greater than a sampling period. In an exemplary embodiment of the ΣΔ modulator, either one element or certain elements or all the elements of the ΣΔ modulator are integrated in a semiconductor.

The resistors 63 may either be made on a piezoelectric substrate or made inside a ceramic pack or mounted in it. The capacitors 62 may be made inside a ceramic pack or mounted in this ceramic pack. One or more resonators 61–62 may be either ceramic resonators or surface acoustic wave (SAW) resonators or bulk acoustic wave resonators (BAW), or variants thereof such as FBAR (fundamental bulk acoustic resonators) or HBAR (high-order bulk acoustic resonators) or TFR (thin-film resonators), or dielectric resonators, or resonators made of supraconductive material, or GmC type resonators [capacitor+transconductance amplifier]. Furthermore, the piezoelectric substrate of the acoustic resonators (SAW, BAW, TFR, FBAR, HBAR) may be integrated on silicon.

The making of the elements of the filter (resistor, capacitor and inductor) on a piezoelectric substrate resolves the problems of interconnections between the elements and simplifies the making of the filter. One of the advantages of the making of the elements of the filter (resistor, capacitor and inductor) on a piezoelectric substrate or inside a ceramic pack is that it provides greater control over the transfer function of the filter. Furthermore, the filter made on a piezoelectric substrate may be mounted on a semiconductor comprising one or more of the elements of the ΣΔ modulator.

The examples of application given have been illustrated by the ΣΔ modulator. They may be extended to application in any type of feedback loop. Through the invention, a feedback loop comprising a latency number strictly greater than 1 can be made without any risk of instability in this loop.

What is claimed is:

1. A bandpass sigma delta modulator forming a feedback loop, comprising:
    a filter, carrying out the bandpass integration of a signal presented at an input therof, wherein said bandpass integration is performed in real time, and wherein said filter comprises a resonance device with minimum phase variation, said resonance device comprising:
    a resonator;
    a resistor whose function becomes predominate over a function of said resonator in one or more determined frequency bands,
    wherein said resonance device with minimum phase variation is a phase lead device when the function of the resistor is predominate in a frequency band comprising the resonance frequency.

2. The modulator according to claim 1, wherein said resonance device with minimum phase variation is a phase delay device when the function of the resistor is predominate in frequency bands that are symmetrical relative to the resonance frequency and excluding the resonance frequency.

3. The modulator according to claim 2, wherein said resonance device with minimum phase variation and with phase delay comprises a series resonator in parallel with the resistor, said series resonator comprising an inductor and a capacitor in series.

4. The modulator according to claim 1, wherein said resonance device with minimum phase variation and with phase lead comprises a series resonator in series with the resistor, said series resistor comprising an inductor and a capacitor in series.

5. The modulator according to claim 1, wherein said filter is a higher order filter.

6. The modulator according to claim 1, wherein the resonance device with minimum phase variation are assembled either in cascade or in a ladder configuration or in a balanced-bridge configuration.

7. The filter according to claim 1, wherein elements forming the filter are made on a piezoelectric substrate or inside a ceramic package.

8. The modulator according to claim 1, wherein one of more of the resonators is one of a ceramic resonator, surface acoustic wave resonator (SAW), bulk acoustic wave resonator (BAW), fundamental Bulk Acoustic Resonator (FBAR), High-Order Bulk Acoustic Resonator (HBAR), Thin Film Resonator (TFR), dielectric resonator, resonator made of supra-conductive material, and GmC type resonator.

9. The modulator according to claim 1, wherein said resonance device with minimum phase variation comprises a parallel resonator in series with the resistor, said parallel resonator comprising an inductor and a capacitor in parallel.

10. The modulator according to claim 1, wherein said resonance device with minimum phase variation and with phase lead comprises a parallel resonator in parallel with the resistor, said parallel resonator comprising an inductor and a capacitor in parallel.

11. The modulator according to claim 1, wherein said resonance device with minimum phase variation, comprises a first arm with a series resonator, said series resonator comprising an inductor and a capacitor in series, a second arm in parallel with the series resonator of the first arm, the second arm comprising a capacitor, and a resistor in parallel with the series resonator of the first arm and the capacitor of the second arm, or in series with the device formed by the series resonator and the capacitor.

12. The modulator according to claim 1, wherein one of more of the resonators is a resonator selected from the group consisting of ceramic resonator, surface acoustic wave resonator (SAW), bulk acoustic wave resonator (BAW), fundamental Bulk Acoustic Resonator(FBAR), High-Order Bulk Acoustic Resonator (HBAR), Thin Film Resonator (TFR), dielectric resonator, resonator made of supra-conductive material, and GmC type resonator.

13. The modulator according to claim 1, wherein said resonance device with minimum phase variation, comprises a first arm with a series resonator, said series resonator comprising an inductor and a capacitor in series a second arm in parallel with the series resonator of the first arm, the second arm comprising a capacitor, and a resistor in parallel with the series resonator of the first arm and the capacitor of the second arm, or in series with the device formed by the series resonator and the capacitor.

* * * * *